United States Patent
Chang et al.

(10) Patent No.: US 7,420,227 B2
(45) Date of Patent: Sep. 2, 2008

(54) CU-METALIZED COMPOUND SEMICONDUCTOR DEVICE

(75) Inventors: Edward Yi Chang, Hsinchu (TW); Shang-Wen Chang, Banciao (TW); Cheng-Shih Lee, Guishan Shiang (TW)

(73) Assignee: National Chiao Tung University, Hsinchu (TW)

( * ) Notice: Subject to any disclaimer, the term of this patent is extended or adjusted under 35 U.S.C. 154(b) by 98 days.

(21) Appl. No.: 11/158,070

(22) Filed: Jun. 22, 2005

(65) Prior Publication Data

US 2006/0292785 A1 Dec. 28, 2006

(51) Int. Cl.
*H01L 29/45* (2006.01)
(52) U.S. Cl. .................. 257/197; 257/565; 257/584; 257/587; 257/741; 257/744; 257/745; 257/762; 257/768; 257/E29.111; 257/E29.139; 257/E29.143; 257/E29.144
(58) Field of Classification Search .................. None
See application file for complete search history.

(56) References Cited

U.S. PATENT DOCUMENTS

| 6,312,761 | B1 | 11/2001 | Harada |
| 2003/0047753 | A1* | 3/2003 | Fujita et al. ............... 257/197 |
| 2004/0026701 | A1* | 2/2004 | Murai et al. ............... 257/79 |

OTHER PUBLICATIONS

Chang et al. A Gold Free Fully Copper Metallized InGaP/GaAs HBT. 2004. 12th GAAS Symposium—Amsterdam. pp. 299-301.*
Chang et al. Use of WNx as the Diffusion Barrier for Interconnect Copper Metallization of InGaP-GaAs HBTs. Jul. 2004, IEEE Transactions On Electron Devices. vol. 51, No. 7. pp. 1053-1059.*
Machac et al, W/Pt/Ge/Pd Contact Optimization for the Measurement of GaAs Quantum Structures. Oct. 5-7, 1998. IEEE. pp. 167-170.*
Rawal et al. Properties of W-Ge-N as a diffusion barrier material for Cu. Applied Physics Letters. 2005. vol. 87, pp. 111902-1 through 111902-3.*
Rawal et al. Investigation of W-Ge-N deposited on Ge as a diffusion barrier for Cu metallization. Applied Physics A. Sep. 14, 2006. vol. 85, pp. 325-329.*
Jill S Becker et al., Diffusion barrier properties of tungsten nitride films grown by atomic layer deposition. . . , Journal Apr. 7, 2003, pp. 2239-2241, vol. 82 No. 14, American Institute of Physics.
Seshadri Ganguli et al., Development of tungsten nitride film as barrier layer for copper metallization, Journal, Jan. 2000, pp. 237-241, vol. 18 No. 1, Journal of Vacuum Science and Technology B.
S C Sun et al., A new CVD tungsten nitride diffusion barrier for Cu interconnection, Symposium, Jun. 1996, pp. 46-47, VLSI Technology, Digest of Technical Papers.
Byung Lyul Park et al., Characteristics of PECVD grown tunsten nitride films as diffusion barrier layers for ULSI DRAM applications, Journal, Feb. 1997, Journal of Electronic Materials.

* cited by examiner

*Primary Examiner*—Andy Huynh
*Assistant Examiner*—Hoang-Quan Ho
(74) *Attorney, Agent, or Firm*—WPAT, P.C.; Anthony King

(57) ABSTRACT

The present invention is a compound semiconductor device characterized in that it is Cu-metalized to improved the reliability of the device and to greatly reduce the cost of production.

9 Claims, 8 Drawing Sheets

CU-METALIZED COMPOUND SEMICONDUCTOR DEVICE

BACKGROUND OF THE INVENTION

1. Field of the Invention

The present invention relates to a semiconductor device; more particularly, relates to replacing Au with Cu in an ohmic contact layer and a metal interconnect of a related compound semiconductor made of GaAs or InP.

2. Description of the Prior Art

A traditional compound semiconductor device (of an HBT (Heterojunction Bipolar Transistor) structure or a HEMT (High-Electron-Mobility transistor) structure) uses Au for an ohmic metal layer and a metal interconnect. Concerning RC delay, Cu can be used to replace Au with a lower resistance and a better heat dissipation for a better compound semiconductor device. As stated in the U.S. Pat. Nos. 6,444,567 and 6,319,819, a Cu production is obtained by a Cu CMP (Chemical Mechanical Polishing) and an obstruction between Cu and a dielectric layer. In the U.S. Pat. No. 6,455,425, a Cu production is obtained by a selective deposition of a Cu CMP planarization and an obstruction between Cu and a dielectric layer. In the U.S. Pat. No. 6,452,276, an alpha-wolfram is used as a diffusion barrier to Cu; and, in U.S. Pat. Nos. 6,437,440 and 6,291,885, a TaN. In the U.S. Pat. No. 6,180,523, Cu/Au interconnects are made in an eletronless way while its adhering layer is made of Ni, Al, polysilicon or $PdSi_x$ and its diffusion barrier is made of Ni—B compound, Ni, Pd or Co, having a plug of Au or Cu.

In Taiwan, a prior art for Cu production uses a TaN plated by electroplating as a diffusion barrier and a metal damascene on silicon by CMP. Another prior art obtains a dual damascene of metal on a silicon layer by electroplating. Still another prior art uses a metal plasma sputtering process to plate Ti and uses CVD (Chemical Vapor Deposition) and MOCVD (Metal Organic Chemical Vapor Deposition) to deposit TiN as a diffusion barrier to Cu.

Yet, the above prior arts are for silicon productions only and use a complex Cu dual damascene or a CMP process, which are not for the production of compound semiconductor. So, the prior arts do not fulfill users requests on actual use.

SUMMARY OF THE INVENTION

Therefore, the main purpose of the present invention is to provide a compound semiconductor device metalized with Cu in a production process.

To achieve the above purpose, the present invention is a Cu-metalized compound semiconductor device, comprising a substrate, an n-type ohmic contact layer, a p-type ohmic contact layer and a metal interconnect, where the metal interconnect comprises a diffusion barrier and a Cu. The Cu-metalized compound semiconductor device is of an HBT (Heterojunction Bipolar Transistor) structure. When the substrate is made of GaAs, the n-type ohmic contact layer is made of $Pd/Ge/WN_x/Cu$; the p-type ohmic contact layer is made of Pt/Ti/Pt/Cu; and, the metal interconnect is made of Ti/Pt/Cu. When the substrate is made of InP, the n-type ohmic contact layer is made of Ti/Pt/Cu; the p-type ohmic contact layer is made of Pt/Ti/Pt/Cu; and, the metal interconnect is made of Ti/Pt/Cu. The diffusion barrier is made of Ta, TaN, W, $WN_x$, $TiWN_x$, Pt or Pd. And, a Cu metal line pattern, which is of a multi-finger structure, is obtained by the metal interconnect through a lift-off and is applied in a Cu air-bridge.

Or, the present invention can be of a MESFET (Metal Semiconductor Field Effect. Transistor) structure, comprising a substrate, a source, a drain, a gate and a metal interconnect. Therein, the source and the drain are of N-polarity and are made of $PdGe/WN_x/Cu$; the gate is made of Ti/Pt/Cu; and, the metal interconnect 47 is of a Cu air-bridge structure.

The present invention of a Cu-metalized compound semiconductor device replaces Au with Cu to obtain better heat dissipation to improve the reliability of the device and to greatly reduce the cost of production. Accordingly, a Cu-metalized compound semiconductor device is obtained

BRIEF DESCRIPTION OF THE DRAWINGS

The present invention will be better understood from the following detailed descriptions of the preferred embodiments according to the present invention, taken in conjunction with the accompanying drawings, in which.

DETAILED DESCRIPTION OF THE PREFERRED EMBODIMENTS

The following descriptions of the preferred embodiments are provided to understand the features and the structures of the present invention.

Figure 1:
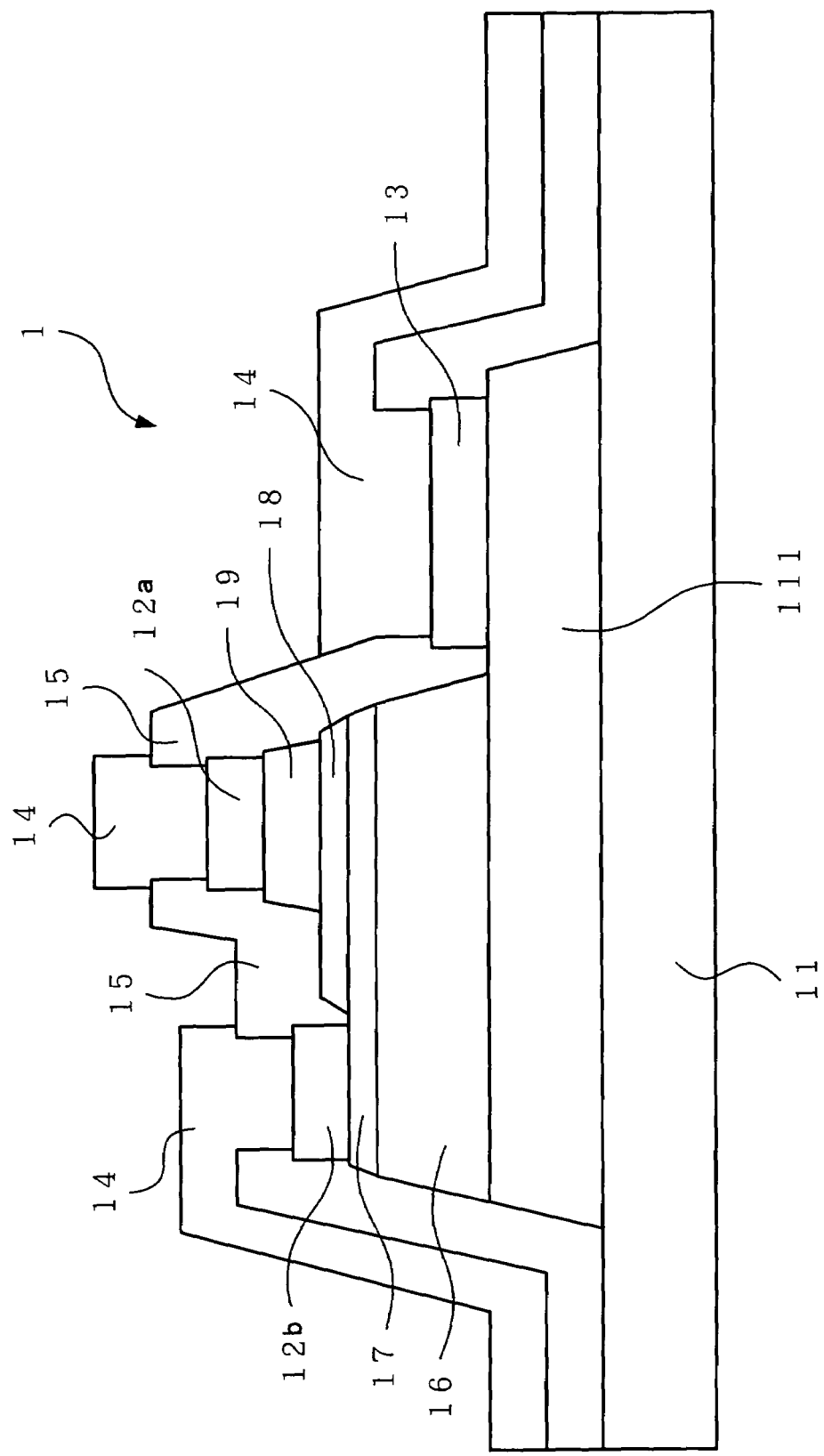
FIG. 1 is a view showing an HBT (Heterojunction Bipolar Transistor) structure for a Cu-metalized compound semiconductor device according to the present invention.
Figure 2A:
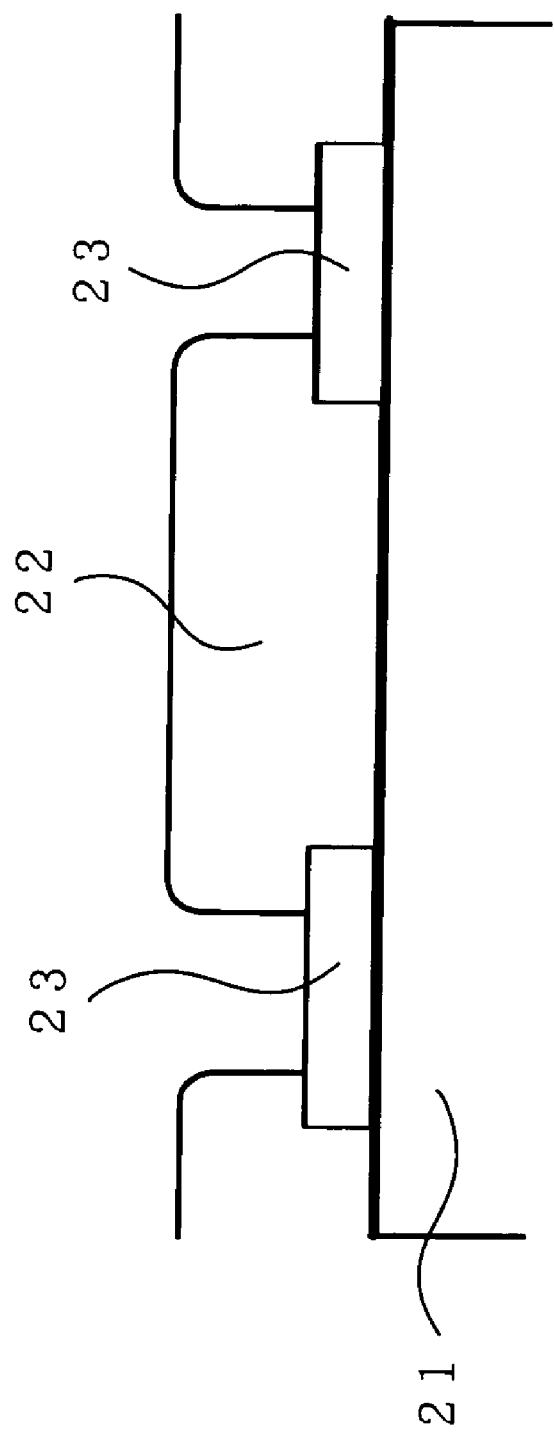
FIG. 2A through FIG. 2E are views showing a structure of a Cu air-bridge according to the present invention.
Figure 2B:
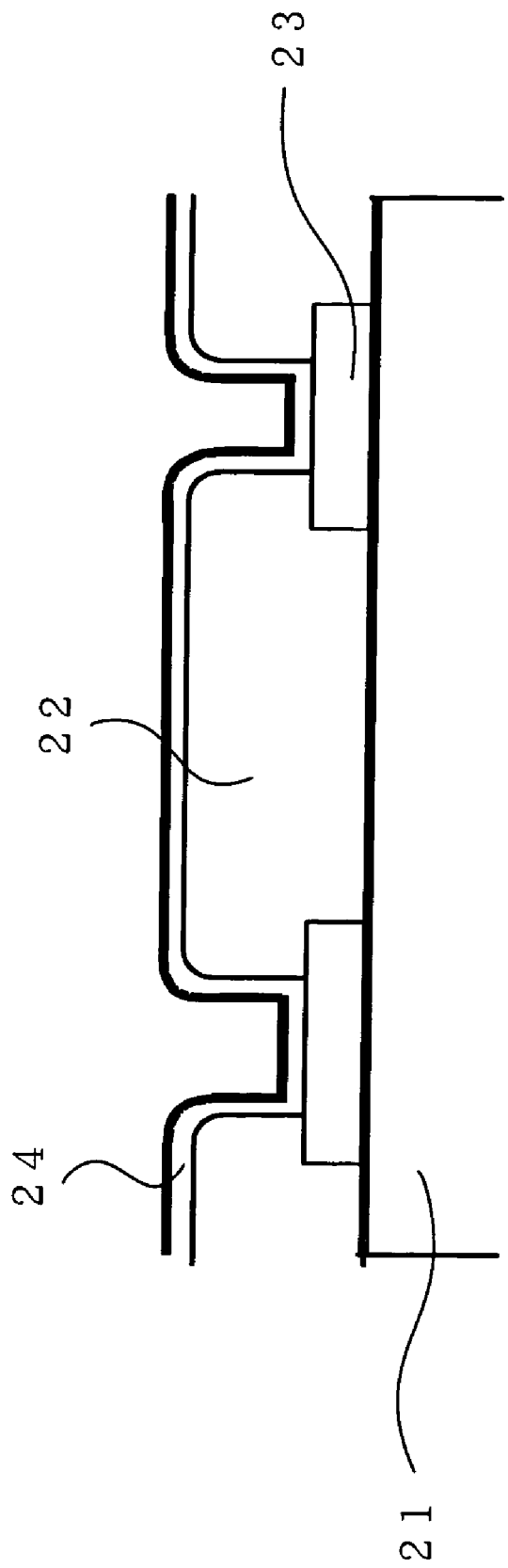
Figure 2C:
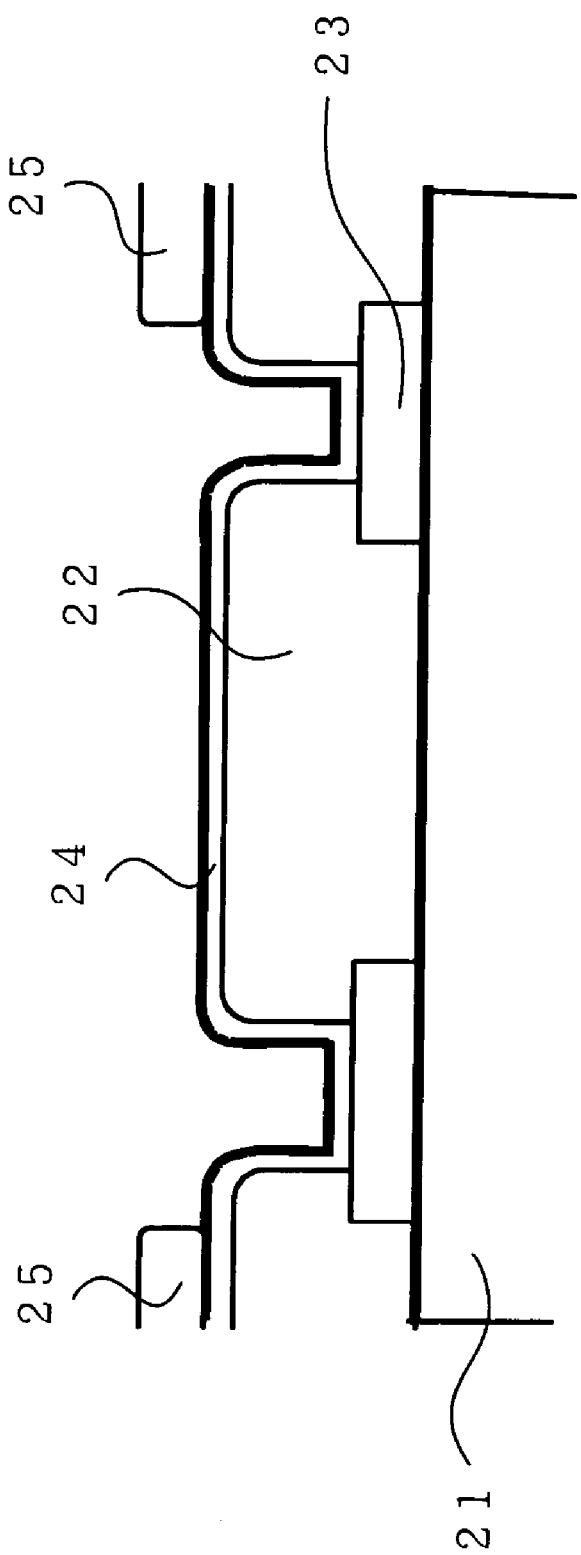
Figure 2D:
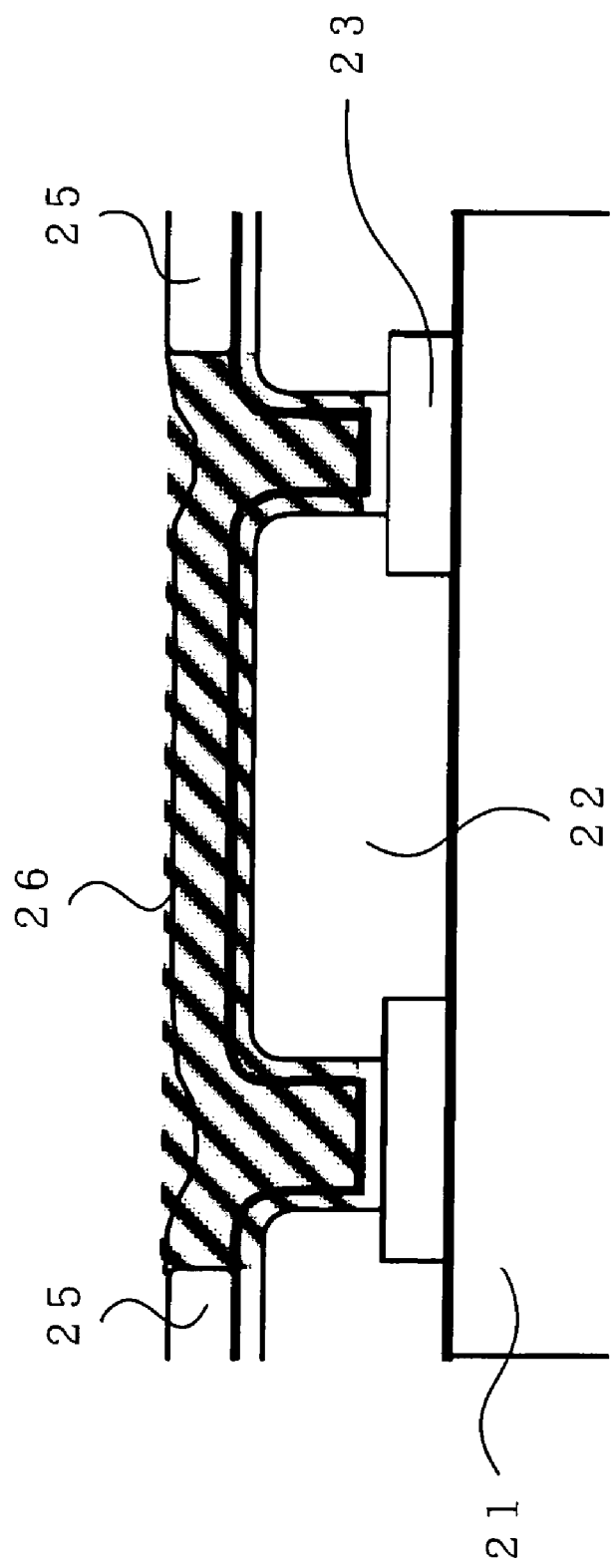
Figure 2E:
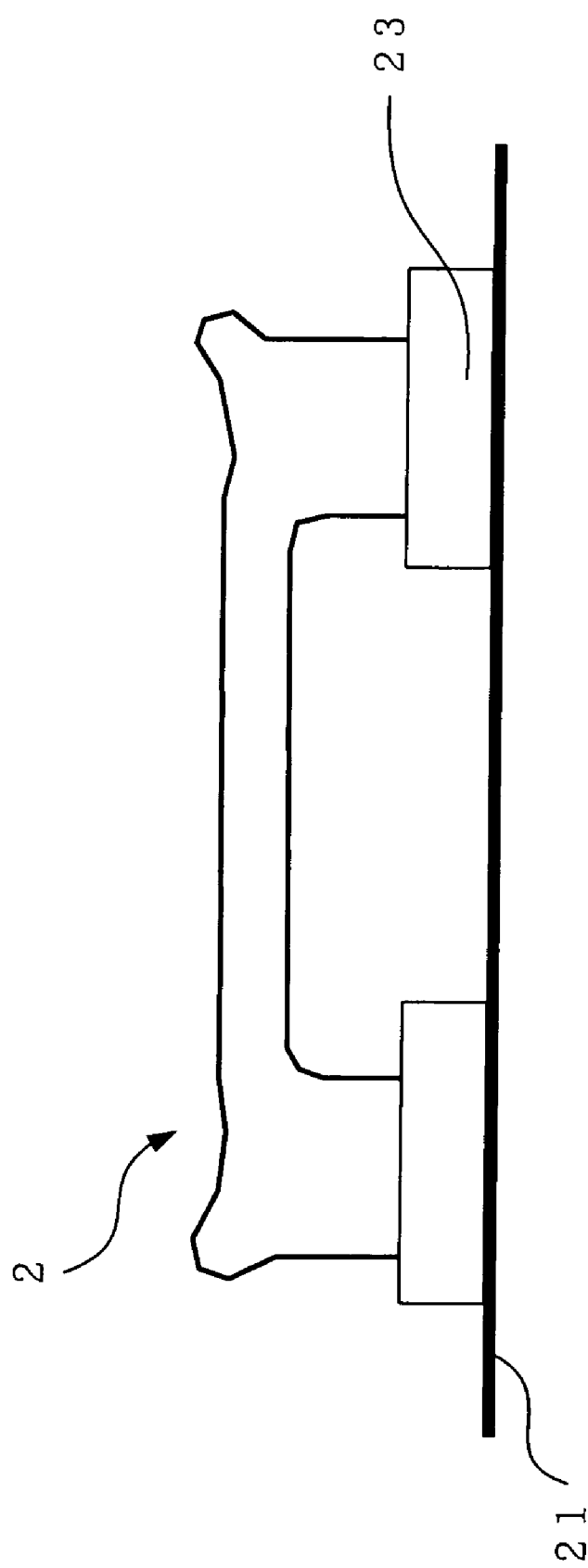

Please refer to FIG. 1, which is a view showing an HBT structure for a Cu-metalized compound semiconductor device according to the present invention. As shown in the figure, the present invention is a Cu-metalized compound semiconductor device 1 of an HBT structure, comprising a substrate 11, an auxiliary base layer 111, a first n-type ohmic contact layer 12a, a p-type ohmic contact layer 13, a second n-type ohmic contact layer 12b, a metal interconnect 14, a dielectric layer 15, a collector layer 16, a base layer 17, an emitter layer 18 and a dotted layer 19. When the substrate 11 is made of GaAs, the first n-type ohmic contact layer 12a and the second n-type ohmic contact layer 12b are made of $Pd/Ge/WN_x/Cu$; the p-type ohmic contact layer 13 is made of Pt/Ti/Pt/Cu; and, the metal interconnect 14 is made of Ti/Pt/Cu. When the substrate 11 is made of InP, the first n-type ohmic contact layer 12a and the second n-type ohmic contact layer 12b are made of Ti/Pt/Cu; the p-type ohmic contact layer 13 is made of Pt/Ti/Pt/Cu; and, the metal interconnect 14 is made of Ti/Pt/Cu. The metal interconnect 14 is obtained by firstly plating with a layer of photoresist on a surface of a compound semiconductor device to be exposed and developed through a photolithography process for defining an area to be plated with metal. Then a diffusion barrier is obtained through a deposition by a sputtering or an electron-beam evaporation to prevent Cu and other materials from inter-diffusion and inter-reaction, where the diffusion barrier is made of Ta, TaN, W, $WN_x$, $TiWN_x$, Pt or Pd. And, a Cu is obtained by a sputtering, an evaporation, a Cu CVD (chemical vapor deposition) or a chemical electroplating. When a sputtering is processed, a collimator is used to obtain better directionality with no step coverage. At last, redundant metal is removed by acetone through a lift-off so that the metal interconnect 14 is obtained.

When the present invention of a Cu-metalized compound semiconductor device uses a substrate 11 of an n-type GaAs, the ohmic contact layers are made of $Pd/Ge/WN_x/Cu$; when the substrate 11 is made of an n-type InP, the ohmic contact layers are made of Ti/Pt/Cu; and, when the substrate 11 is made of a p-type GaAs or a p-type InP, the ohmic contact layers are made of Pt/Ti/Pt/Cu. The Cu of the metal interconnect 14 is prevented to be inter-diffused or inter-reacted with other materials and the substrate 11 by the diffusion barrier; and, the resistance of the present invention is further reduced by the Cu so that the RC (Routing Control) delay of the present invention is reduced. Furthermore, a Cu metal line pattern is obtained with the metal interconnect 14 through a lift-off to be applied in a Cu air-bridge. Please refer to FIG. 2A through FIG. 2E, which are views showing a structure of a Cu air-bridge according to the present invention. As shown in the figures, the production of the Cu air-bridge 2 comprises the following steps:

(a) A first photoresist layer 22 is formed on a GaAs substrate 11 and a metal cushion pier 23 for an air-bridge is defined by a photolithography process.

(b) A metal film layer 24 is plated on the first photoresist layer 22 and on the metal cushion pier 23 by a sputtering or an evaporation; and the metal film layer 24 is made of W/Cu/W.

(c) A second photoresist layer 25 is then formed on the metal film layer 24. After a metal line of the air-bridge is defined through a photolithography process, the redundant wolfram on the surface of the metal film layer 24 is removed.

(d) Finally, an electroplated Cu layer 26 is obtained by an electroplating and the redundancies of the first photoresist layer 22 and the second photoresist layer 25 are removed with acetone and plasma.

Concerning producing an ohmic contact layer, a metal pattern is defined by a photolithography process and a metal multi-layer is obtained by a deposition through a sputtering or an evaporation. In the end, the photoresist and the redundant metal are removed by a lift-off to obtain the ohmic contact layer. Because the ohmic contact layers are Cu-metalized and the metal interconnect is an interconnect metal line made of Cu metal line instead of Au, its transferring speed is faster and its cost is low. In addition, because the Cu used in the present invention has better heat dissipation than Au, for those devices with high power, heat dissipation effect can be improved together with reliability. And, because the price of Cu is lower than that of Au, the cost for production can be greatly reduced.

Figure 3:
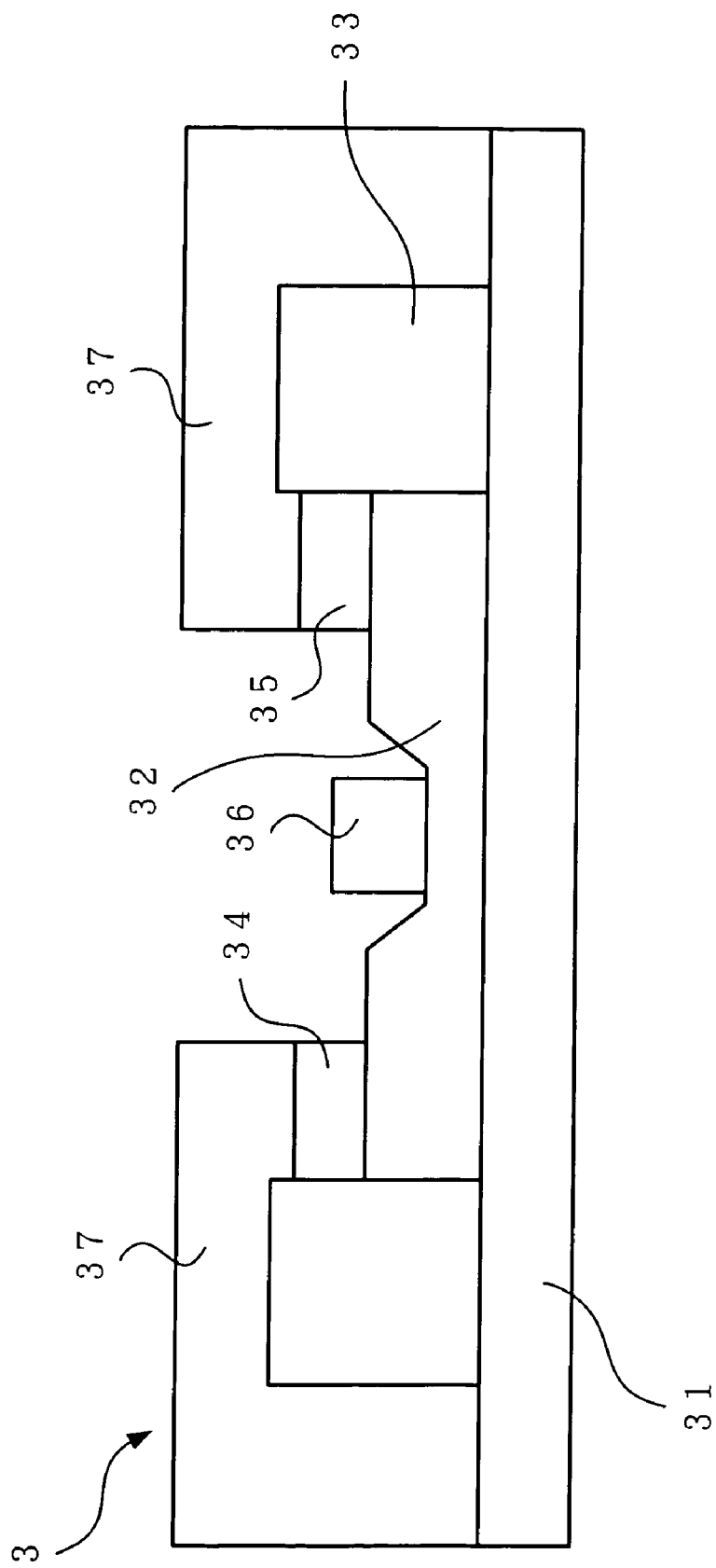
FIG. 3 is a view showing a MESFET (Metal Semiconductor Field Effect Transistor) structure for a Cu-metalized compound semiconductor device according to the present invention.

Please refer to FIG. 3, which is a view showing a MESFET structure for a Cu-metalized compound semiconductor device according to the present invention. As shown in the figure, the present invention is of a MESFET structure 3, comprising a substrate 31, a channel layer 32, an insulation layer 33, a source 34, a drain 35, a gate 36 and a metal interconnect 37. Therein, the source 34 and the drain 35 are of N-polarity and are made of PdGe/WN$_x$/Cu; the gate 36 is made of Ti/Pt/Cu; and, the metal interconnect 37 is of a Cu air-bridge structure.

Figure 4:
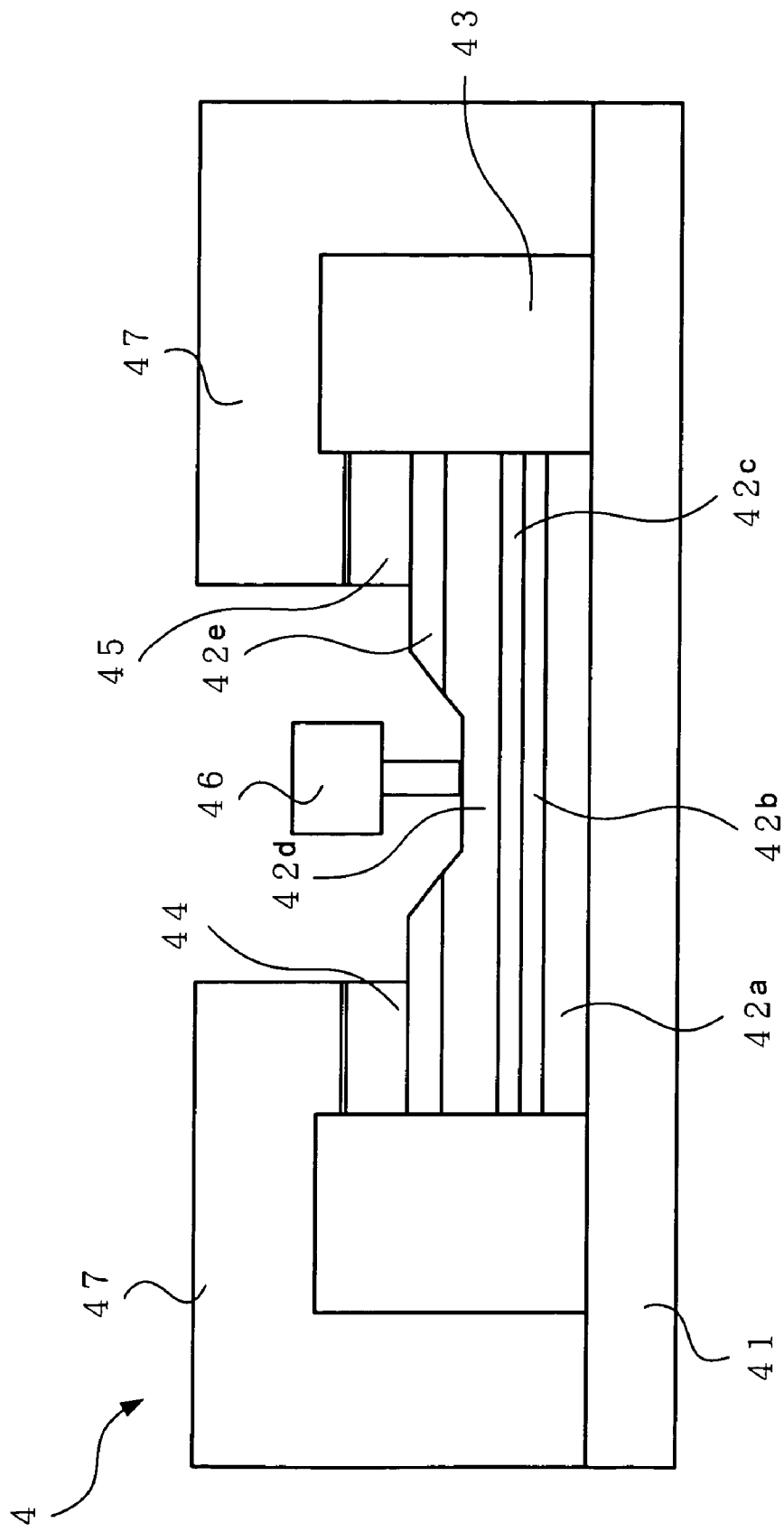
FIG. 4 is a view showing a HEMT (High- Electron-Mobility Transistor) structure for a Cu-metalized compound semiconductor device according to the present invention.

Please refer to FIG. 4, which is a view showing a HEMT structure for a Cu-metalized compound semiconductor device according to the present invention. As shown in the figure, the present invention is of a HEMT structure 3, comprising a substrate 41, a buffer layer 42a, a channel layer 42b, a counter current layer 42c, a blocking layer 42d, a covering layer 42e, an insulation layer 43, a source 44, a drain 45, a gate 46 and a metal interconnect 47. Therein, the source 44 and the drain 45 are of N-polarity and are made of PdGe/WN$_x$/Cu; the gate 36 is made of Ti/Pt/Cu; and, the metal interconnect 47 is of a Cu air-bridge structure.

To sum up, the present invention is a Cu-metalized compound semiconductor device, which is Cu-metalized to speed up the transferring rate, to enhance the effect of heat dissipation, to improve the reliability of the device and to greatly reduce the cost of production.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A Cu-metalized compound semiconductor device having an HBT (Heterojunction Bipolar Transistor) structure, comprising:
    a substrate;
    an auxiliary base layer;
    a first n-type ohmic contact layer;
    a p-type ohmic contact layer;
    a second n-type ohmic contact layer;
    a metal interconnect;
    a collector layer;
    a dielectric layer;
    a base layer;
    an emitter layer; and
    a dotted layer,
    characterized in that
    (a) said substrate is made of GaAs;
    (b) said first n-type ohmic contact layer and said second n-type ohmic contact layer are made of Pd/Ge/WN$_x$/Cu;
    (c) said p-type ohmic contact layer is made of Pt/Ti/Pt/Cu; and
    (d) said metal interconnect is made of Ti/Pt/Cu and is comprised of a diffusion barrier and a Cu.

2. The device according to claim 1, wherein said metal interconnect is obtained by a lift-off with a Cu metal line pattern.

3. The device according to claim 1, wherein said Cu metal line pattern is of a multi-finger structure in a Cu air-bridge.

4. The device according to claim 1, wherein said diffusion barrier is made of a material selected from a group consisting of Ta, TaN, W, WN$_x$, TiWN$_x$, Pt and Pd.

5. The device according to claim 1, wherein said substrate is made of InP; and
    wherein said first n-type ohmic contact layer and said second n-type ohmic contact layer are made of Ti/Pt/Cu.

6. The device according to claim 1, wherein said substrate is made of n-type GaAs; and
    wherein said first n-type ohmic contact layer, said second n-type ohmic contact layer and said p-type ohmic contact layer are made of Pd/Ge/WN$_x$/Cu.

7. The device according to claim 1, wherein said substrate is made of p-type GaAs; and
    wherein said first n-type ohmic contact layer, said second n-type ohmic contact layer and said p-type ohmic contact layer are made of Pt/Ti/Pt/Cu.

8. The device according to claim 1, wherein said substrate is made of n-type InP; and
    wherein said first n-type ohmic contact layer, said second n-type ohmic contact layer and said p-type ohmic contact layer are made of Ti/Pt/Cu.

9. The device according to claim 1, wherein said substrate is made of p-type InP; and
    wherein said first n-type ohmic contact layer, said second n-type ohmic contact layer and said p-type ohmic contact layer are made of Pt/Ti/Pt/Cu.

* * * * *